(12) United States Patent
Lasagni

(10) Patent No.: US 11,653,468 B2
(45) Date of Patent: May 16, 2023

(54) HIGH POWER CONNECTOR AND RELATED ASSEMBLY METHOD

(71) Applicant: META SYSTEM S.p.A., Reggio Emilia (IT)

(72) Inventor: Cesare Lasagni, Reggio Emilia (IT)

(73) Assignee: META SYSTEM S.p.A., Reggio Emilia (IT)

( * ) Notice: Subject to any disclaimer, the term of this patent is extended or adjusted under 35 U.S.C. 154(b) by 0 days.

(21) Appl. No.: 17/275,620

(22) PCT Filed: Sep. 11, 2019

(86) PCT No.: PCT/IB2019/057640
§ 371 (c)(1),
(2) Date: Mar. 11, 2021

(87) PCT Pub. No.: WO2020/053775
PCT Pub. Date: Mar. 19, 2020

(65) Prior Publication Data
US 2022/0053660 A1 Feb. 17, 2022

(30) Foreign Application Priority Data
Sep. 13, 2018 (IT) .......................... 102018000008577

(51) Int. Cl.
H05K 7/14 (2006.01)
(52) U.S. Cl.
CPC ......... H05K 7/1432 (2013.01); H05K 7/1408 (2013.01)

(58) Field of Classification Search
None
See application file for complete search history.

(56) References Cited

U.S. PATENT DOCUMENTS

| 3,187,292 | A | * | 6/1965 | Small | H01R 13/5202 439/275 |
| 3,435,128 | A | * | 3/1969 | Dorwald | H02G 3/22 174/18 |
| 4,174,145 | A | * | 11/1979 | Oeschger | H01R 13/521 439/589 |
| 4,840,547 | A | * | 6/1989 | Fry | F04B 39/121 439/892 |
| 5,227,587 | A | * | 7/1993 | Paterek | H01B 17/305 174/152 R |

(Continued)

FOREIGN PATENT DOCUMENTS

| DE | 102015209279 A1 * | 11/2016 | ........... H01B 17/301 |
| EP | 3 185 406 A1 | 6/2017 | |

*Primary Examiner* — Krystal Robinson
(74) *Attorney, Agent, or Firm* — Aslan Law, P.C.

(57) ABSTRACT

A high power connector comprises an electricity conductive element of substantially elongated conformation and provided with a first end portion electrically connectable to a power electronic circuit of a power electronic apparatus and with a second end portion provided with an electrical connection terminal, the conductive element being insertable inside a through opening made on the cover with said terminal facing outwards, wherein the connector comprises a locking element made of an electrically insulating material that can be coupled with the conductive element and fixable to the outer surface of the cover.

14 Claims, 3 Drawing Sheets

(56) References Cited

U.S. PATENT DOCUMENTS

| | | | | |
|---|---|---|---|---|
| 5,308,925 | A | * | 5/1994 | Paterek ................ H01B 17/305 174/50.56 |
| 6,628,024 | B1 | * | 9/2003 | Mirmobin ............... H02K 5/225 310/71 |
| 6,779,989 | B2 | * | 8/2004 | Makino ................ H01R 13/521 439/685 |
| 6,844,502 | B2 | * | 1/2005 | Deng ..................... H01B 17/30 174/153 R |
| 8,742,255 | B2 | * | 6/2014 | Pavlovic ............ H05K 7/20927 361/752 |
| 2002/0148629 | A1 | * | 10/2002 | Honkomp ............ H01B 17/303 174/50.52 |
| 2002/0155350 | A1 | * | 10/2002 | Spillman ............. H01M 50/553 29/623.2 |
| 2014/0192496 | A1 | * | 7/2014 | Tramet ................... B60L 53/20 361/752 |
| 2018/0151274 | A1 | | 5/2018 | Breuning |
| 2018/0241313 | A1 | | 8/2018 | Goto et al. |

\* cited by examiner

HIGH POWER CONNECTOR AND RELATED ASSEMBLY METHOD

CROSS-REFERENCE TO RELATED APPLICATIONS

This application claims priority to IT Patent Application No. 102018000008577 filed on Sep. 13, 2018, and this application claims priority to and is a 371 of international PCT Application No. PCT/IB2019/057640 filed on Sep. 11, 2019, the entire contents of which are hereby incorporated by reference.

TECHNICAL FIELD

The present invention relates to a high power connector, usable in particular as an external connector in DC-DC converters, battery chargers or the like, and to the related assembly method.

BACKGROUND ART

The need is known to manufacture power electrical apparatuses provided with high power connectors accessible from the outside.

For example, this need is particularly felt in the automotive sector, in particular with reference to the production of power electronic apparatuses installed on board electric or hybrid vehicles for the conversion of an input voltage/current into a suitable output voltage/current, such as OBC (On-Board Chargers) chargers or DC-DC converters.

Such power electronic apparatuses generally comprise one or more power or control electronic boards, composed of one or more printed circuits, housed inside a suitable container. The container is hermetically sealed using a special cover.

With reference to such apparatuses, the need is known to manufacture high power connectors accessible from the outside and arranged at the cover. However, the positioning and electrical connection of these connectors is complex.

In fact, the known types of connector are generally fixed to the cover and, after the cover itself has been fixed for closing the container, it is necessary to connect the connector to the internal electronics.

For this purpose, it is necessary to make suitable access openings to be made on the container or to use long wirings that, given the currents involved, are not good for this type of application.

This makes the assembly and electrical connection operations complex. Furthermore, the container must be provided with a suitable access opening and relative closing means, e.g. with a door. Therefore, the container itself is more complex with inevitably higher production costs.

DESCRIPTION OF THE INVENTION

The main aim of the present invention is to devise a high power connector and a related assembly method which allow the assembly and electrical connection operations to be simplified.

Another object of the present invention is to devise a high power connector and a related assembly method which allow overcoming the aforementioned drawbacks of the prior art within a simple, rational, easy, effective to use and affordable solution.

The objects set forth above are achieved by the present high power connector according to claim 1.

BRIEF DESCRIPTION OF THE DRAWINGS

Other characteristics and advantages of the present invention will become more evident from the description of a preferred but not exclusive embodiment of a high power connector and related assembly method, illustrated by way of an indicative example, not limited thereto, in the accompanying tables of drawings in which.

EMBODIMENTS OF THE INVENTION

Figure 1:
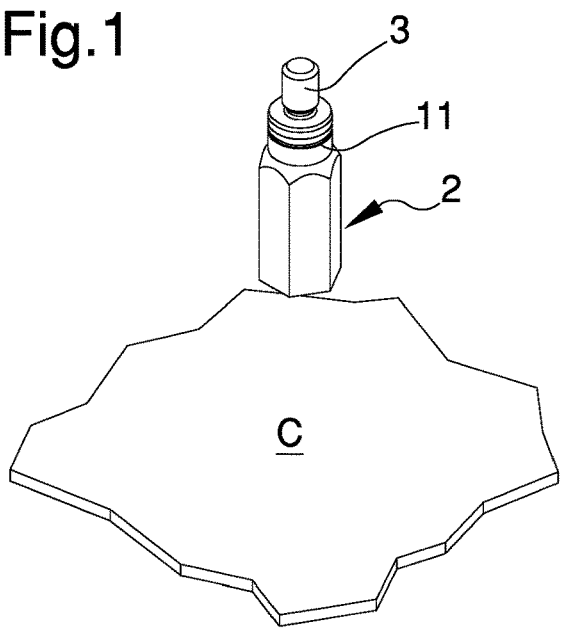
FIGS. 1 to 6 illustrate different steps of the assembly method of the connector according to the invention.

With particular reference to these illustrations, reference numeral 1 globally indicates a high power connector, installable in particular on a power apparatus. For example, the connector 1 according to the invention can be used in the automotive sector, in particular with reference to the production of electronic power apparatuses installed on board electric or hybrid vehicles, such as OBC (On-Board Charger) battery chargers or DC-DC converters.

Figure 7:
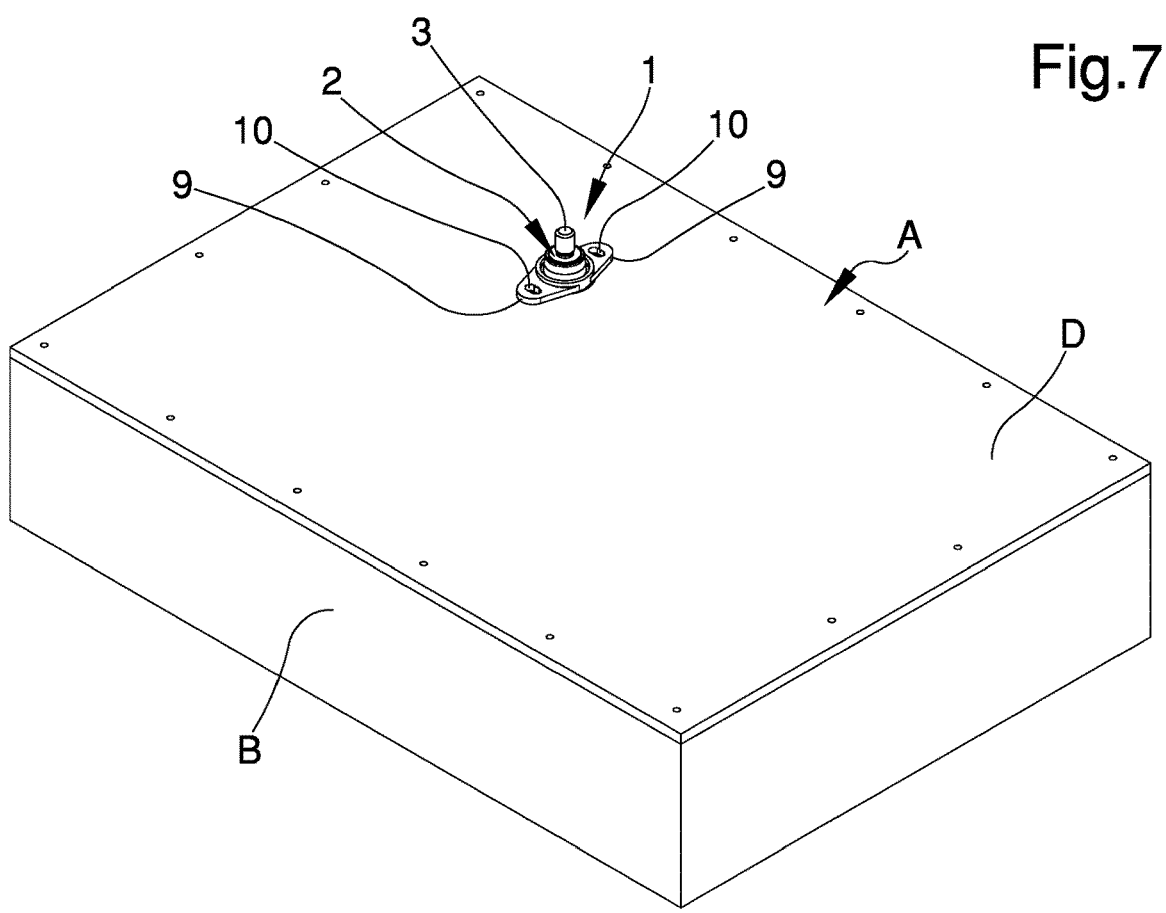
FIG. 7 schematically shows an electronic apparatus provided with the connector according to the invention.

Generally speaking, as schematically shown by way of example in FIG. 7, the connector 1 can be used on a power electronic apparatus A comprising a container B, at least one power electronic circuit C housed inside the container B, and at least one cover D for closing the container B.

Advantageously, the connector 1 comprises at least one electricity conductive element 2 of substantially elongated conformation and provided with a first end portion electrically connectable to the power electronic circuit C and with a second end portion provided with at least one electrical connection terminal 3.

Preferably, the conductive element 2 is made of a metal material.

In particular, the conductive element 2 is insertable inside a through opening E made on the cover D. After being inserted, the terminal 3 faces outwards and is therefore accessible for the connection of a further connector.

Advantageously, furthermore, the connector 1 comprises at least one locking element 4, made of an electrically insulating material, which can be coupled with the conductive element 2 and fixable to the outer surface of the cover D.

The locking element 4 enables therefore the conductive element 2 to be effectively locked on the cover, in a simple and quick manner.

Preferably, the locking element 4 is made of a polymeric material.

According to a preferred embodiment, shown in the figures, the connector 1 comprises coupling means between the conductive element 2 and the locking element 4.

In particular, the coupling means are composed of coupling means in rotation between the conductive element 2 and the locking element 4 with respect to the longitudinal axis of the conductive element itself.

Therefore, after the locking element 4 has been fixed to the cover D, the conductive element 2 is also locked in rotation.

Figure 5:
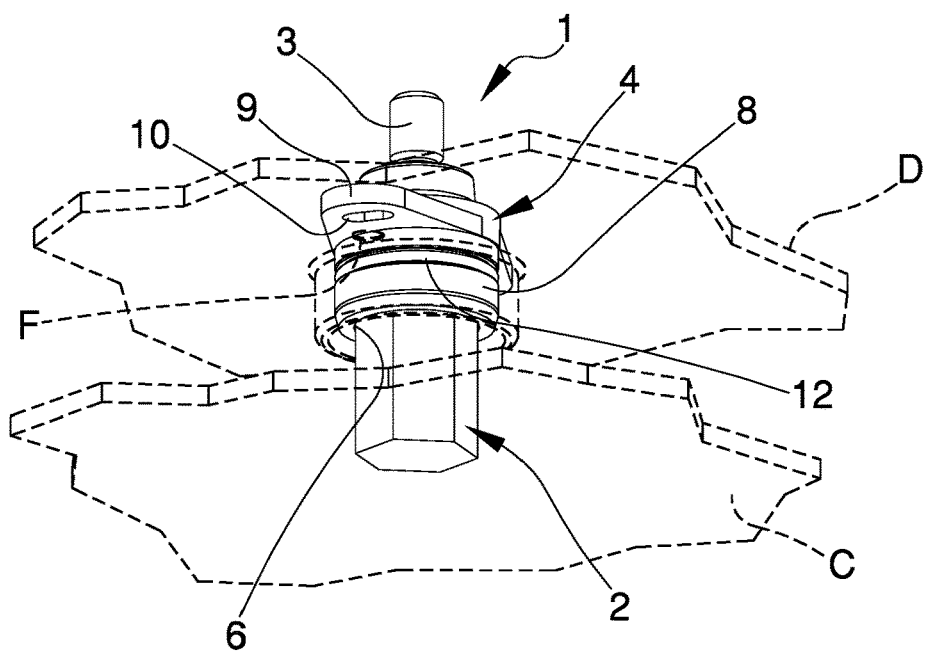

With reference to the preferred embodiment shown in the illustrations, the locking element 4 comprises at least one housing seat 5, visible in FIG. 5, adapted to house at least partly the second end portion of the conductive element 2, when the locking element 4 is fixed to the outer surface of the cover D.

In particular, the locking element 4 comprises a portion provided with an access opening 6 for the access to the housing seat 5, through which the second end portion of the conductive element 2 can be inserted.

Conveniently, with reference to the preferred embodiment shown in the illustrations, the portion provided with the access opening 6 is insertable at least partly and to measure inside the through opening E made on the cover D.

Moreover, the locking element 4 comprises at least one outlet opening 7 of the terminal 3 of the conductive element 2, when the locking element itself is fixed to the outer surface of the cover D.

With particular reference to a possible embodiment, shown in the figures, the locking element 4 comprises a body 8 with a substantially cylindrical and tubular conformation provided at one end with the access opening 6 and at an opposite end with the outlet opening 7.

In particular, the end of the body of the locking element 4 provided with the outlet opening 7 has a substantially cylindrical conformation with a cross-section having a diameter decreasing towards the outside. In this configuration, the end provided with the outlet opening 7 and the terminal 3 constitute an attachment designed to connect a corresponding connector.

Different conformations of the locking element 4 cannot however be ruled out. In fact, the shape of the locking element 4 can be adapted and modified according to the particular shape of the through opening E on the cover D or of the specific connector to be connected to the terminal 3.

Preferably, the coupling means between the conductive element 2 and the locking element 4 are constituted by polygonal coupling means.

In particular, with reference to the specific embodiment shown in the illustrations, the coupling means comprise one portion of the conductive element 2 provided with an outer transverse profile of polygonal conformation.

Furthermore, the coupling means comprise one portion of the inner surface of the housing seat 5 of the locking element 4 provided with an inner transverse profile of polygonal conformation.

The outer transverse profile of the conductive element 2 and the inner transverse profile of the housing seat 5 are mutually complementary and coupleable to measure for the locking of the locking element 4 in rotation on the conductive element 2. Specifically, as shown in the illustrations, these profiles can be hexagonal. Different conformations cannot however be ruled out.

The locking element 4 also comprises fixing means 9, 10 to the cover D.

Preferably, such fixing means 9, 10 comprise at least one portion 9 projecting from the outer surface of the body of the locking element 4 which surface is provided with at least one fixing hole 10.

The fixing hole 10 is positionable at a respective hole F on the cover D for fixing by means of screws or the like.

With reference to the preferred embodiment shown in the figures, the fixing means 9, 10 comprise a pair of lateral fins 9 projecting from the body of the locking element 4 and opposite to each other. Both lateral fins 9 are provided with respective fixing holes 10.

Conveniently, the fixing holes 10 are composed of slots. Preferably, these slots 10 are curvilinear.

This way, following the positioning of the locking element 4 on the cover D and the coupling with the conductive element 2 it is possible to fix the locking element itself even if the slots 10 are not perfectly centered on the holes F of the cover D.

Advantageously, the connector 1 comprises sealing means 11, 12 adapted to ensure a perfect sealing between the conductive element 2 and the locking element 4 and between the locking element 4 and the cover D.

In particular, the sealing means 11, 12 comprise at least a first gasket 11 interposed between the outer surface of the conductive element 2 and the inner surface of the housing seat 5 of the locking element 4.

Preferably, as shown in the figures, the first gasket 11 is composed of an o-ring positioned inside a relative circular seat formed at a cylindrical portion of the conductive element 2, in the proximity of the terminal 3.

Figure 6:
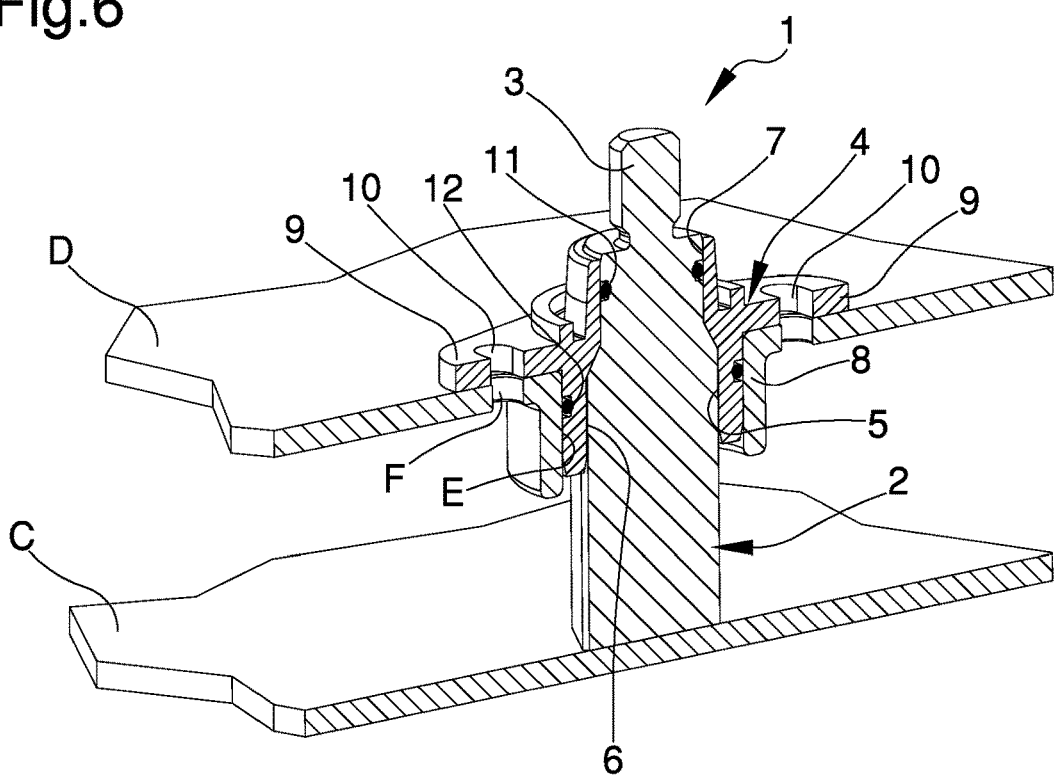

As shown in FIG. 6, after the locking element 4 has been inserted on the second end portion of the conductive element 2, the first gasket 11 is positioned in the proximity of the outlet opening 7.

Furthermore, the sealing means 11, 12 comprise at least a second gasket 12 arranged along at least one stretch of the body of the locking element 4. As shown in FIG. 6, the second gasket 12 is adapted to be interposed between the outer surface of the locking element itself and the inner surface of the through opening E of the cover D, when the locking element 4 is fixed to the cover D.

The method for assembling the high power connector 1 according to the invention is described below.

First, as schematically shown in FIG. 1, the method provides for the connection of the first end portion of the conductive element 2 to the power electronic circuit C.

Preferably, this connection provides for the fixing of the first end portion of the conductive element 2 to at least one suitable support of the power electronic apparatus A.

In particular, the first end portion of the conductive element 2 can be fixed directly to a printed circuit PCB, to a suitable frame or to a bus bar of the electronic apparatus A.

Figure 2:
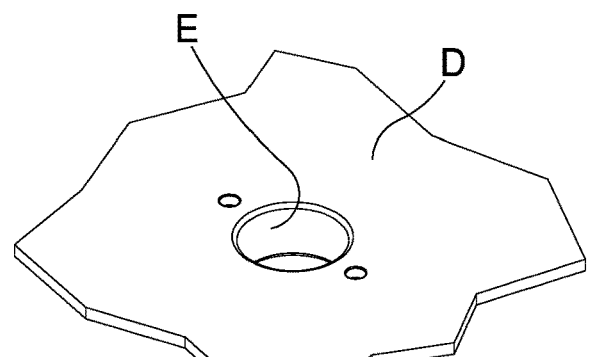

Subsequently, as schematically shown in FIG. 2, the method provides for the positioning of the cover D onto the container B and the positioning of the second end portion of the conductive element 2 inside the through opening E of the cover D.

The cover D is then fixed to the container B to close the compartment containing the electronics.

Figure 3:
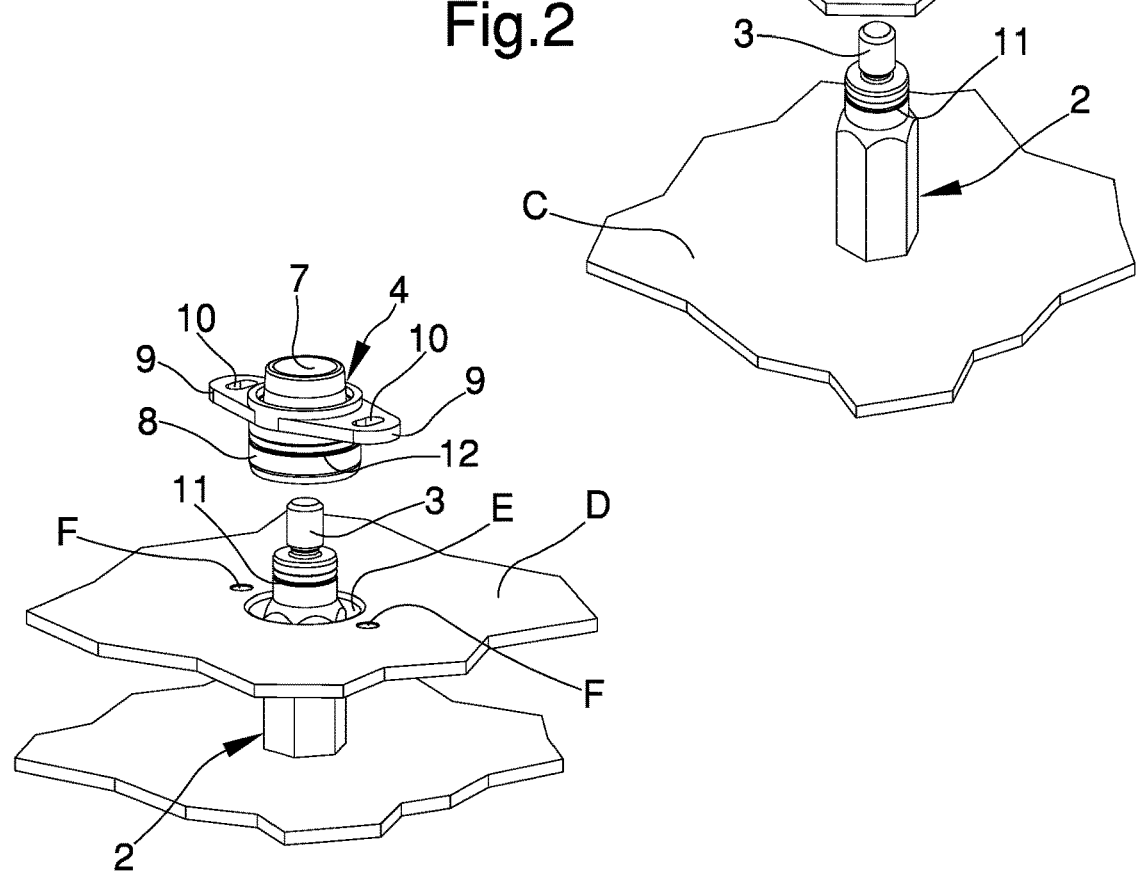
Figure 4:
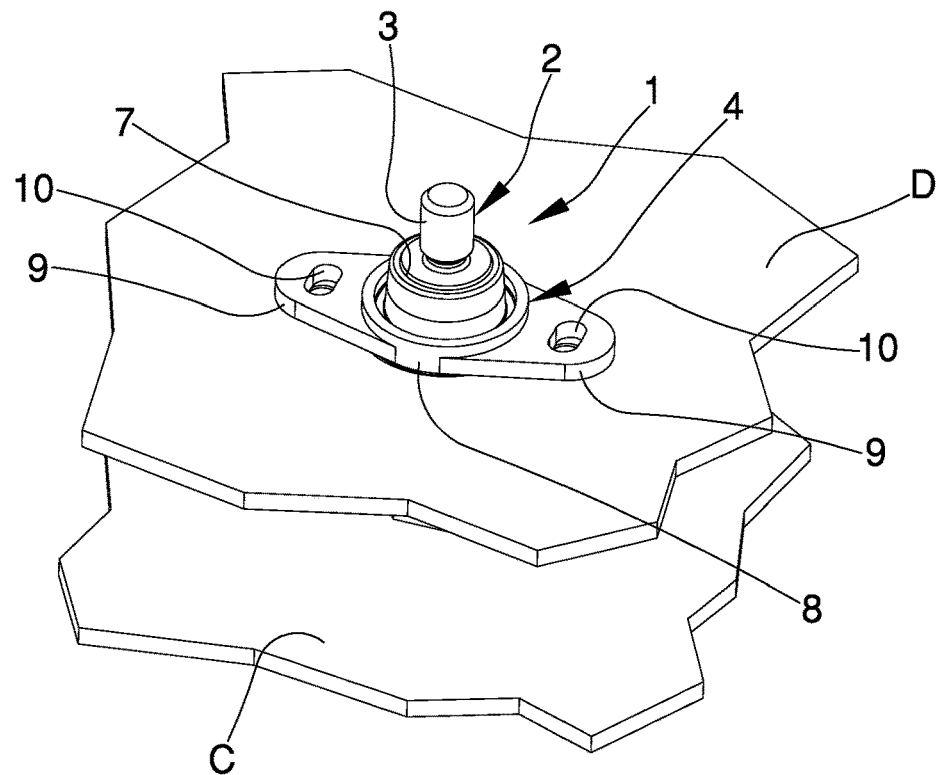

Subsequently, as shown in FIGS. 3, 4 and 5, the locking element 4 is positioned at the through opening E with the second end portion of the conductive element 2 arranged inside the housing seat 5 of the locking element 4 and with the terminal 3 projecting from the outlet opening 7 of the locking element itself.

In particular, the positioning of the locking element 4 must be carried out by aligning the slots 10 on the lateral fins 9 of the locking element 4 with the respective holes F on the cover D.

Finally, the method provides for fixing the locking element 4 to the outer surface of the cover D.

This fixing can be carried out by means of screws or similar threaded means inserted in the slots 10 and locked inside the holes F on the cover D.

The electronic apparatus A according to the invention can be used in particular in the automotive sector and consists of a power electronic apparatus installed on board electric or hybrid vehicles.

For example, the electronic device A may consist of an OBC (On-Board Charger) battery charger or a DC-DC converter.

The electronic apparatus A comprises a container B, at least one power electronic circuit C housed inside the container B, and at least one cover D for closing the container B. Advantageously, the electronic apparatus A comprises at least one high power connector 1 similar to the connector 1 described above.

In particular, the first end portion of the conductive element 2 is electrically connected to the power electronic circuit C and the second end portion of the conductive element 2 is inserted inside the through opening E made on the cover D with the terminal 3 facing to the outside. Furthermore, the locking element 4 is coupled to the conductive element 2 and is fixed to the outer surface of the cover D. It has, in practice, been ascertained that the described invention achieves the intended objects.

In particular, it is emphasized the fact that the connector according to the invention allows considerably simplifying the assembly and electrical connection operations.

The invention claimed is:

1. A high power connector, installable on a power electronic apparatus, the high power connector comprising:
   a container;
   at least one power electronic circuit housed inside said container;
   at least one cover for closing said container; and
   sealing means,
   wherein said high power connector comprises at least one electricity conductive element of substantially elongated conformation and provided with a first end portion electrically connectable to said at least one power electronic circuit and with a second end portion provided with at least one electrical connection terminal, said at least one electricity conductive element being insertable inside a through opening made on said at least one cover with said at least one electrical connection terminal facing outwards, said high power connector comprises at least one locking element made of an electrically insulating material that can be coupled with said at least one electricity conductive element and configured to be fixable to an outer surface of said at least one cover when said cover is fixed to said container,
   wherein said high power connector comprises coupling means between said at least one electricity conductive element and said locking element, said coupling means comprising at least one portion of said at least one electricity conductive element provided with an outer transverse profile of polygonal conformation and at least one portion of the inner surface of a housing seat of the locking element provided with an inner transverse profile of polygonal conformation, said outer transverse profile and said inner transverse profile being mutually complementary and adapted to be coupled to measure for the locking of said locking element in rotation on said at least one electricity conductive element,
   wherein said locking element comprises fixing means to said cover, said fixing means comprising at least one portion projecting from the outer surface of said locking element and provided with at least one fixing hole, said fixing hole being positionable at a respective hole on said cover for fixing by means of screws,
   wherein said fixing hole is slot-shaped, and
   wherein said sealing means comprise at least a second gasket arranged along at least one stretch of said at least one locking element and adapted to be interposed between an outer surface of said at least one locking element and an inner surface of said through opening of the at least one cover, when said at least one locking element is fixed to said at least one cover.

2. The high power connector according to claim 1, wherein
   said coupling means comprise coupling means in rotation between said at least one electricity conductive element and said at least one locking element with respect to the longitudinal axis of said at least one electricity conductive element.

3. The high power connector according to claim 1, wherein
   said at least one locking element comprises at least said housing seat adapted to house at least partly said second end portion of the at least one electricity conductive element, when said at least one locking element is fixed to the outer surface of the at least one cover.

4. The high power connector according to claim 3, wherein
   said at least one locking element comprises a portion provided with an access opening to said housing seat.

5. The high power connector according to claim 4, wherein
   said portion provided with the access opening is insertable at least partly inside said through opening on the at least one cover.

6. The high power connector according to claim 1, wherein
   said at least one locking element comprises at least one outlet opening of said at least one electrical connection terminal of the at least one electricity conductive element, when said at least one locking element is fixed to the outer surface of the at least one cover.

7. The high power connector according to claim 1, wherein
   said sealing means comprise at least a first gasket interposed between an outer surface of said at least one electricity conductive element and an inner surface of said housing seat of the at least one locking element.

8. The high power connector according to claim 7, wherein
   said sealing means comprise at least a second gasket arranged along at least one stretch of said at least one locking element and adapted to be interposed between an outer surface of said at least one locking element and an inner surface of said through opening of the at least one cover, when said at least one locking element is fixed to said at least one cover.

9. The high power connector according to claim 1, wherein
   said at least one electricity conductive element is made of metallic material.

10. The high power connector according to claim 1, wherein
    said at least one locking element is made of polymeric material.

11. A power electronic apparatus for vehicles, the power electronic apparatus comprising:
    said container;
    said at least one power electronic circuit housed inside said container;
    the at least one cover of said container provided with said at least one through opening;
    said at least one high power connector according to claim 1, wherein
    said first end portion of the at least one electricity conductive element is electrically connected to said power electronic circuit and said second end portion is inserted inside said through opening made on the at least one cover with said terminal facing outwards, and wherein said at least one locking element is coupled to said at least one electricity conductive element and is fixed to the outer surface of said at least one cover.

12. The high power connector according to claim 1, wherein
said fixing means comprise at least one portion projecting from the outer surface of said at least one locking element and provided with at least one fixing hole, said at least one fixing hole being positionable at a respective hole on said cover.

13. An assembly method of a high power connector, wherein the assembly method comprising:
connecting a first end portion of at least one electricity conductive element to a power electronic circuit;
positioning at least one cover on a container with a second end portion of said at least one electricity conductive element inserted inside a through opening of the at least one cover;
positioning at least one locking element at said through opening, with said second end portion of the at least one electricity conductive element arranged inside a housing seat of the at least one locking element and with a terminal protruding from an outlet opening of the at least one locking element; and
fixing said at least one locking element to an outer surface of said at least one cover when said cover is fixed to said container, wherein
said high power connector comprises coupling means between said at least one electricity conductive element and said locking element, said coupling means comprising at least one portion of said at least one electricity conductive element provided with an outer transverse profile of polygonal conformation and at least one portion of the inner surface of said housing seat of the locking element provided with an inner transverse profile of polygonal conformation, said outer transverse profile and said inner transverse profile being mutually complementary and adapted to be coupled to measure for the locking of said locking element in rotation on said at least one electricity conductive element,
said locking element comprises fixing means to said cover, said fixing means comprising at least one portion projecting from the outer surface of said locking element and provided with at least one fixing hole, said fixing hole being positionable at a respective hole on said cover for fixing by means of screws,
said fixing hole is slot-shaped, and
sealing means comprise at least a second gasket arranged along at least one stretch of said at least one locking element and adapted to be interposed between an outer surface of said at least one locking element and an inner surface of said through opening of the at least one cover, when said at least one locking element is fixed to said at least one cover.

14. The assembly method according to claim 13, further comprising:
fixing said first end portion of the at least one electricity conductive element to at least one support of a power electronic apparatus.

* * * * *